(12) United States Patent
Daruwalla et al.

(10) Patent No.: US 11,381,268 B1
(45) Date of Patent: Jul. 5, 2022

(54) SWITCHABLE CLAMPS ACROSS ATTENUATORS

(71) Applicant: pSemi Corporation, San Diego, CA (US)

(72) Inventors: Parvez Daruwalla, San Diego, CA (US); Sung Kyu Han, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/359,084

(22) Filed: Jun. 25, 2021

(51) Int. Cl.
*H04B 1/16* (2006.01)
*H03F 3/195* (2006.01)
*H04B 1/18* (2006.01)
*H03G 3/30* (2006.01)

(52) U.S. Cl.
CPC ........... *H04B 1/1615* (2013.01); *H03F 3/195* (2013.01); *H03G 3/3052* (2013.01); *H04B 1/18* (2013.01); *H03F 2200/294* (2013.01)

(58) Field of Classification Search
CPC ......... H04B 1/1615; H04B 1/18; H03F 3/195; H03F 2200/294; H03G 3/3052
See application file for complete search history.

(56) References Cited

U.S. PATENT DOCUMENTS

| | | | | |
|---|---|---|---|---|
| 2016/0134312 A1* | 5/2016 | Kaczynski | ............. | H04B 1/109 455/249.1 |
| 2017/0278840 A1* | 9/2017 | Robbins | .............. | H01L 27/0292 |
| 2018/0226367 A1* | 8/2018 | Babcock | ................. | H03F 1/223 |

* cited by examiner

*Primary Examiner* — Nguyen T Vo
(74) *Attorney, Agent, or Firm* — Steinfl + Bruno LLP

(57) ABSTRACT

Methods and devices for limiting the power level of low noise amplifiers (LNA) implemented in radio frequency (RF) receiver front-ends. The described methods are applicable to bypass, low and high gain modes of the LNA. According to the described methods, the decoder allows the signal to be clamped before or after being attenuated. The benefit of such methods is to improve large signal performances (e.g. IIP3, P1dB) of the RF receiver front-end, while still meeting the clamping requirements, or improve (lower) clamped output power, while still meeting large signal performances (e.g. IIP3, P1dB).

24 Claims, 9 Drawing Sheets

200

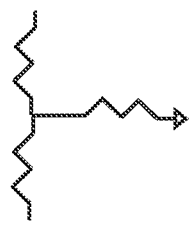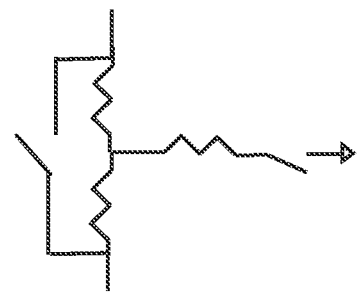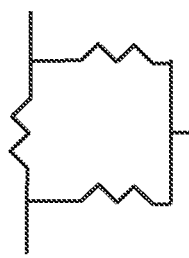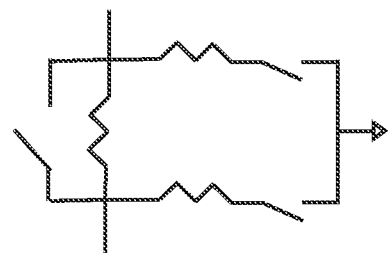

SWITCHABLE CLAMPS ACROSS ATTENUATORS

BACKGROUND

(1) Technical Field

The present disclosure is related to clamping methods and devices used in radio frequency (RF) systems, more in particular to clamping methods and devices implemented in the RF front-receivers to limit the output power of low noise amplifiers (LNA) when a high input power is applied.

(2) Background

The receiver front-end of RF transceivers generally includes one or more LNAs. One of the requirements of the LNAs is a maximum output power in the presence of higher input powers. In some case, such output power limitation may be required for all LNA inputs, all gain modes (e.g. active and passive gain modes) and/or across all operational frequency bands.

In the active gain mode, the LNA saturation inherently limits the output power. In this mode, a problem arises when the required maximum output power is less than the saturation power of the LNA. In this case, solutions to limit the output power of the LNA are needed. However, in the typical cases where the LNA saturates at a power less than the required maximum output power, there will be no issue. The problem more commonly arises in the passive gain mode where the signal path may be through a series of switches and attenuators, and therefore a mechanism to limit the LNA output power is always required.

One solution that has been commonly used is to clamp the signal power before attenuation. Such method provides maximum clamping but has a negative impact on performance parameters such as the Input Third Order Intercept Point (IIP3) and/or the 1 dB Compression Point (P1dB).

In view of the above, solutions are needed to limit the output power of the LNA based on the maximum output power requirements while also maintaining performance parameters such as IIP3/P1dB within the specifications. Such solutions should be applicable for all LNA inputs, all gain modes and across all operational frequency bands.

SUMMARY

The disclosed methods and devices address the above-mentioned problems.

According to a first aspect of the present disclosure, a radio frequency (RF) receiver front-end is provided, comprising: a first signal path having a first signal path input and a first signal path output; one or more first attenuators disposed in the first signal path; a clamping circuit switchably connected, through a clamping switch (S21), to the one or more first attenuators and configured to switchably clamp an input signal through the first signal path i) at an input of any first attenuator of the one or more first attenuators or ii) at the first signal path output, thereby maintaining a signal power level at the first signal path output at less than a set threshold.

According to a second aspect of the present disclosure, a radio frequency (RF) receiver front-end is provided, comprising: a first signal path having a first signal path input and a first signal path output; a low noise amplifier (LNA) disposed in the first signal path; a series arrangement of one or more first attenuators disposed at an output of the LNA in the first signal path; a clamping circuit switchably connected, through a clamping switch to the one or more first attenuators and configured to clamp an input signal i) at an input of any first attenuator of the one or more first attenuators or ii) at the first signal path output, thereby maintaining a signal power level at the first signal path output at less than a set threshold.

According to a third aspect of the present disclosure, a radio frequency (RF) receiver front-end is provided, comprising: a first signal path having a first signal path input; a low noise amplifier (LNA) disposed in the first signal path; a series arrangement of one or more attenuators coupling the first signal path input to an input of the LNA; the series arrangement of the one or more attenuators being disposed in the first signal path; a clamping circuit switchably connected, through a clamping switch (S11), to the series arrangement of one or more attenuators and configured to switchably clamp an input signal through the first signal path i) at an input of any attenuator of the one or more attenuators or ii) at an output of the series arrangement of the one or more attenuators, thereby maintaining a signal power level at an output of the LNA at less than a set threshold.

According to a fourth aspect of the present disclosure, a reconfigurable radio frequency (RF) circuit configurable to be operated according to a first mode a second mode, and a third mode, the circuit comprising an amplifier; a first, second and third series arrangement of one or more attenuators; and corresponding first, second and third switchable clamping arrangements configured to switchably clamp a signal through the reconfigurable RF circuit i) at an input of any attenuator of the respective first, second and third series arrangement or ii) at an output of the respective first, second and third series arrangement; wherein the reconfigurable RF circuit is configured i) in the first mode, to convey the signal from a first input, through the amplifier and the third series arrangement, to an output of the RF circuit, the third switchable clamping arrangement being active, the first and the second clamping arrangement being inactive, ii) in the second mode, to convey the signal from a second input, through the first series arrangement and the amplifier, to the output of the RF circuit, at least one of the first and third switchable clamping arrangement being active, the second clamping arrangement being inactive, and iii) in the third mode to convey the signal from the second input, through the third series arrangement, to the output of the RF circuit, at least one of the first and second switchable clamping arrangement being active, the third clamping arrangement being inactive.

According to a fifth aspect of the present disclosure, a method of limiting an output power level of a radio frequency (RF) receiver front-end at less than a set threshold in a bypass mode is disclosed, the method comprising: providing a low noise amplifier (LNA); providing a series arrangement of one or more attenuators in a bypass path; connecting an output of the series arrangement of the one or more attenuators to an output of the RF receiver front-end; disconnecting an output of the LNA from the output of the RF receiver front-end; disconnecting the output of the series arrangement of the one or more attenuators from an input of the LNA; during the bypass mode, receiving an input signal at an input of the series arrangement of the one or more attenuators; clamping the input signal at either an input of an attenuator of the one or more attenuators, or at the output of the series arrangement of the one or more attenuators to generate a clamped signal, and feeding the clamped signal to the output of the RF receiver front-end.

The details of one or more embodiments of the present disclosure are set forth in the accompanying drawings and the description below. Other features, objects, and advantages of the invention will be apparent from the description and drawings, and from the claims.

DESCRIPTION OF THE DRAWINGS

FIGS. 5A-5D show exemplary implementations of attenuators.

Like reference numbers and designations in the various drawings indicate like elements.

DETAILED DESCRIPTION

Clamping circuits or clamps are arrangements that reduce the power level of a signal to an acceptable value (i.e. less than a set threshold) in order to prevent overvoltage conditions.

Figure 1:
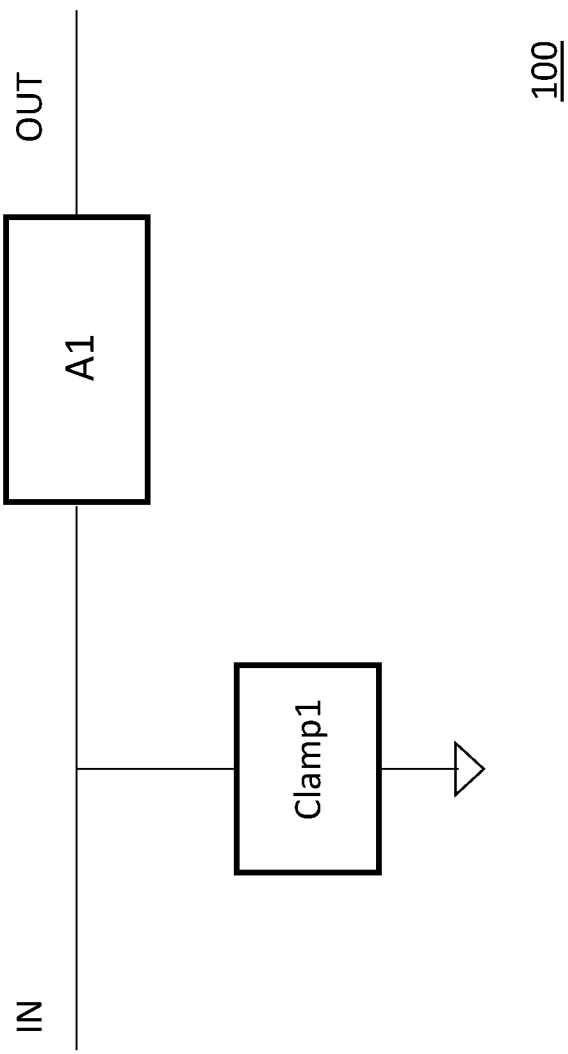
FIG. 1 shows a prior art circuit illustrating a clamping method.

FIG. 1 shows a prior art circuit (100) illustrating the typical way clamping is performed. Circuit (100) can be used, for example, in the bypass path of an LNA implemented in an RF receiver front-end. As can be seen, the clamping is performed at input (IN) of attenuator (A1). The clamped signal is then passed through attenuator (A1) to generate an attenuated signal at output (OUT). As mentioned previously, although such an approach preserves maximum clamping, it degrades the large signal performance (e.g. IIP3/P1dB) of the RF receiver front-end.

Figure 2:
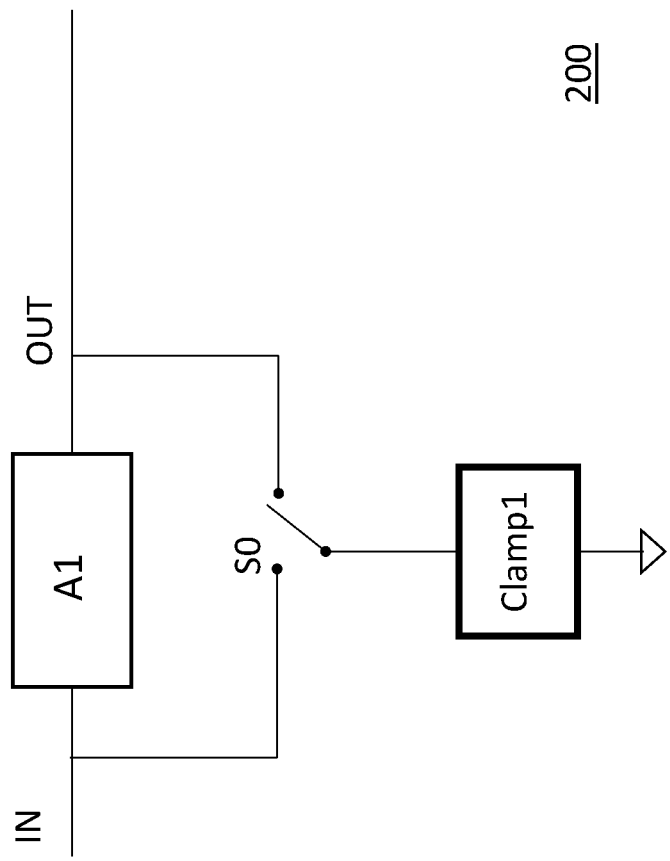
FIG. 2 shows an exemplary circuit illustrating the clamping concept according to an embodiment of the present disclosure.

FIG. 2 shows a circuit (200) illustrating the clamping concept in accordance with the teachings of the present disclosure. Circuit (200) may be implemented, for example, as part of an RF receiver front-end and includes switch (S0), attenuator (A1) and clamping circuit (Clamp1). In contrast with circuit (100) of FIG. 1, in the embodiment of FIG. 2, clamping may selectively be performed either at input (IN) or at output (OUT) of attenuator (A1). In accordance with an embodiment of the present disclosure, switch (S0) may be controlled based on specific requirements, gain modes (e.g. some gain modes do not require high IIP3), frequency band (e.g. lower frequencies inherently clamp at higher power, and higher frequencies clamp at lower power), or any other desired control logic. The person skilled in the art will appreciate that, by virtue of clamping the signal, for example, at output (OUT), the clamping performance may slightly be degraded (still staying well within the specifications) while improving the IIP3/P1dB performance by the attenuation value provided by attenuator (A1).

In order to further clarify the above-disclosed concept and associated benefits, exemplary embodiments of the present disclosure will be described more in detail below.

Figure 3A:
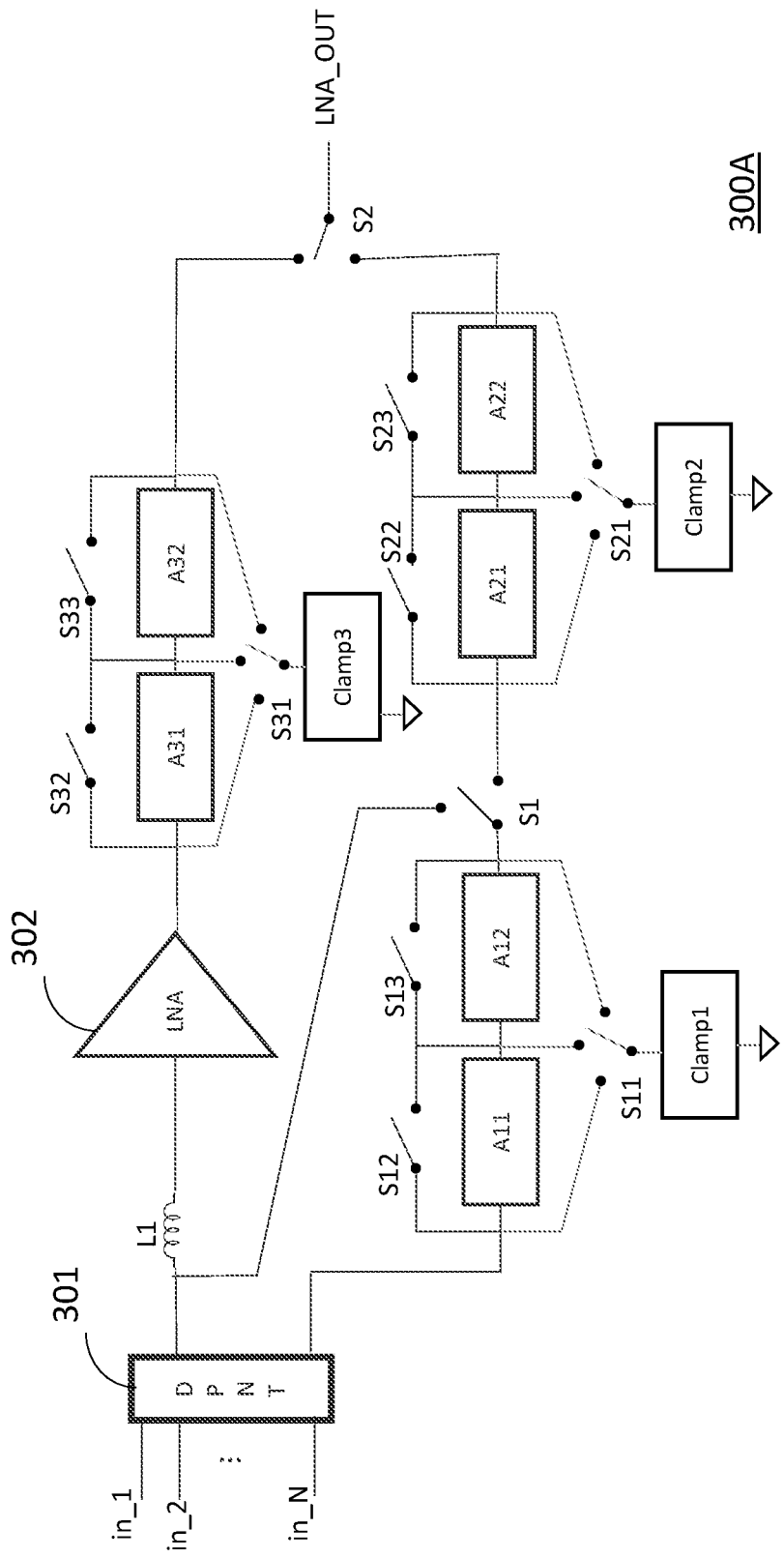
FIGS. 3A-3D show exemplary RF receiver front-ends according to embodiments of the present disclosure.

FIG. 3A shows an exemplary RF receiver front-end (300A) according to an embodiment of the present disclosure. RF receiver front-end (300A) comprises a DPNT double-pole N-throw switch (301) with inputs (in_1, . . . , in_N) selected based on the desired frequency band, inductor (L1), LNA (302), switchable attenuators (Aij, i=1, . . . , 3, j=1,2), clamping circuits (clamp1, . . . , clamp3), and switches (S1, S2, Sij, i, j=1, . . . , 3). Switches (S11, S21, S31) may be single-pole N-throw (SPNT) switches with an isolation (ISO) mode or any other type of switches depending on overall performance requirements. As described further in detail below, depending on the states of such switches, different signal paths (depending on the selected gain modes) and various clamping points with different attenuations can be selected. According to the teachings of the present disclosure, the clamping capability may be provided, alone or in combination:

a) before switch (S1) (Clamp1+switch (S11))
b) after switch (S1) (Clamp2+switch (S21)), and/or
c) after the LNA output (Clamp3+switch (S31)).

Figure 3B:
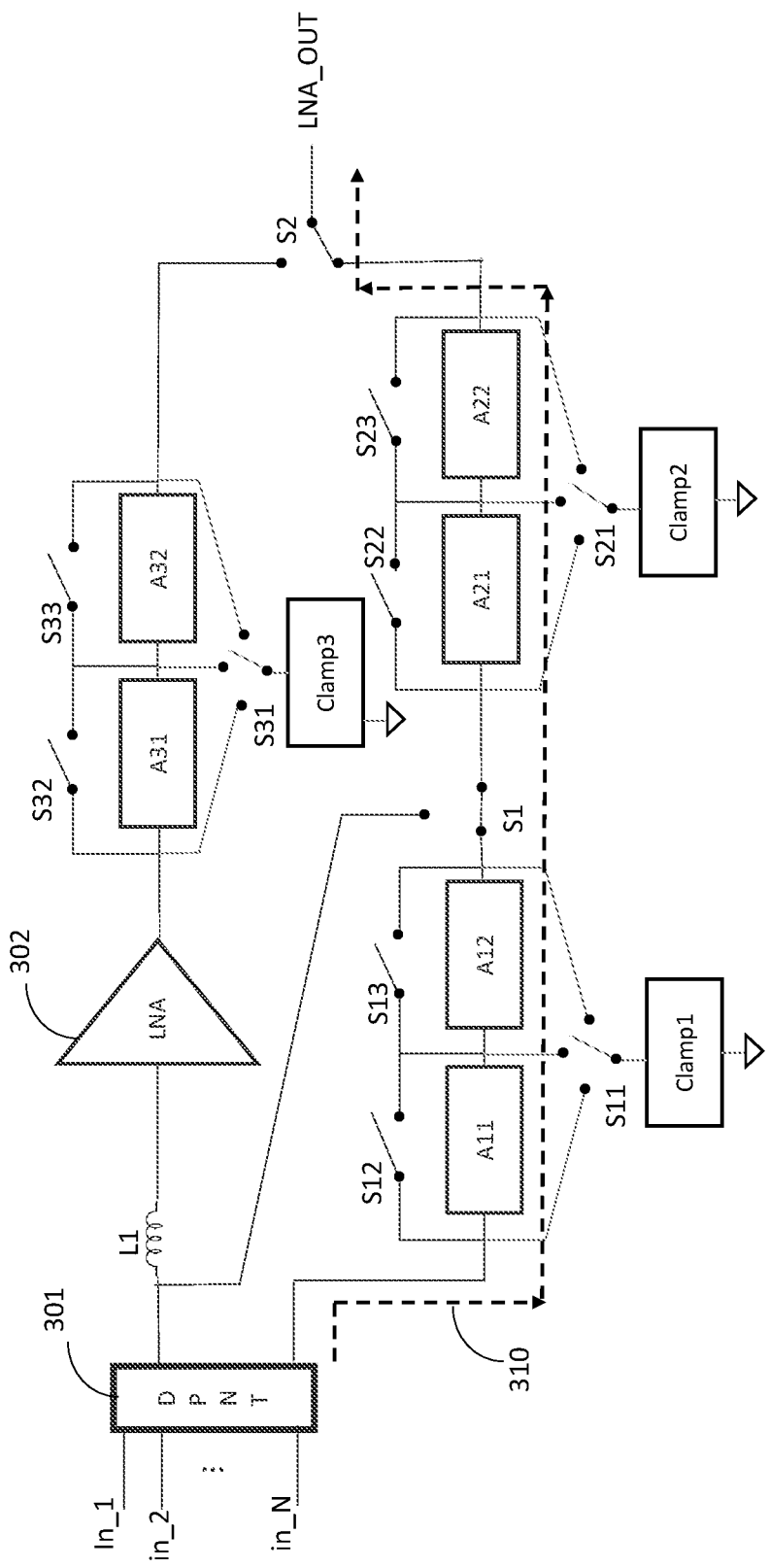

FIG. 3B shows RF receiver front-end (300A) of FIG. 3A operating in bypass passive mode where the signal path is indicated by dotted line (310). In a preferred embodiment, switchable clamping is performed after switch (S1). In this case, depending on the states of switches (S21, S22, S23), either one of or both attenuators (A21, A22) can be switched in and clamping may be performed at the input or output of either attenuator (A21, A22). In this preferred embodiment of clamping after switch (S1)) in the bypass passive mode:

a1. clamping will have no impact on the overall performance in the active mode where the signal path is through LNA (302).

a2. activation of clamping circuit (Clamp1) and associated switch (S11) is optional.

a3. clamping circuit (Clamp3), switches (S31, S32, S33), and attenuators (A31, A32) may be optional.

a4. the state of switches (S12, S13, S22, S23) depends on the performance requirements and the desired attenuation in the signal path.

With further reference to FIG. 3B, an alternative embodiment for the bypass mode may be envisaged where clamping is performed before switch (S1) and using clamping circuit (Clamp1) instead of (Clamp2). In this case, depending on the states of switches (S11, S12, S13), either or both attenuators (A11, A12) can be switched in and clamping may be performed at the input or output of any of the attenuators (A11, A12). In such alternative embodiment for the bypass mode:

b1. large signal performance (IIP3, P1dB) in low gain, active mode may be degraded b2. Activation of clamping circuit (Clamp2) and associated switch (S21) is optional b3. clamping circuit (Clamp3), switches (S31, S32, S33), and attenuators (A31, A32) may be optional b4. the state of switches (S12, S13, S22, S23) depends on the performance requirements and the desired attenuation in the signal path b5. attenuators (A21, A22) and corresponding switches (S22, S23) are optional.

Figure 3C:
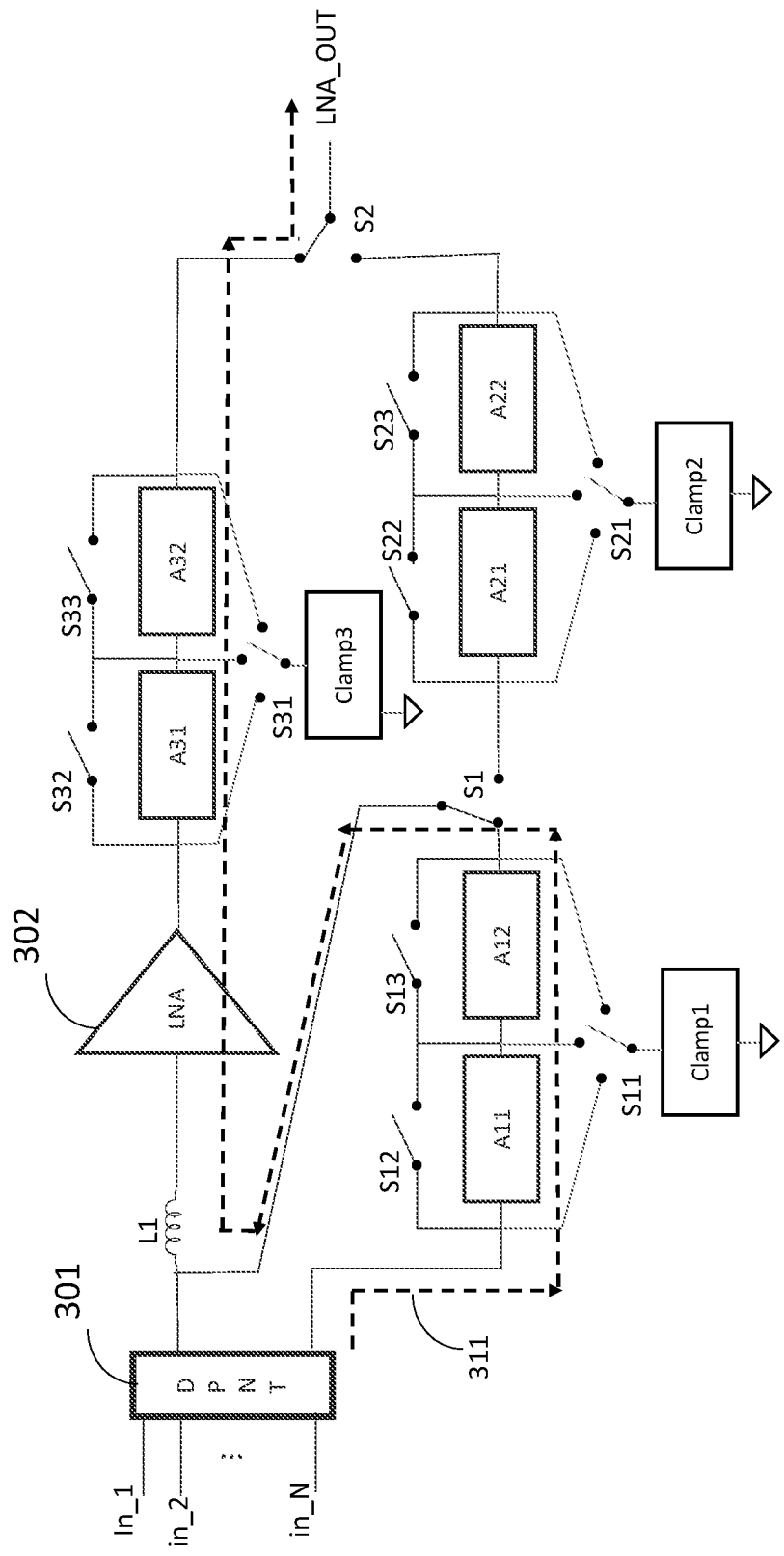

FIG. 3C shows RF receiver front-end (300A) of FIG. 3A operating in low gain active mode where the signal path is indicated by dotted line (311). In the low gain active mode the signal is attenuated before passing through the LNA to the output. In a first embodiment:

c1. clamping is performed using clamping circuit (Clamp1).

c2. Activation of clamping circuit (Clamp3) and the corresponding switch (S31) is optional.

c3. Either one of or both switchable attenuators (A11, A12) may be selectively switched in through switch (S11) and clamping may selectively be performed at the input or output of the switchable attenuators (A11, A12).

With reference to FIG. 3C, in a second embodiment:
d1. clamping is performed downstream of LNA (302) using clamping circuit (Clamp3).
d2. activation of clamping circuit (Clamp1) and the corresponding switch (S11) is optional.
d3. Either or both switchable attenuators (A31, A32) may be selectively switched in through switches (S32, S33) and clamping may selectively be performed at the input or output of the switchable attenuators (A31, A32).

With further reference to FIG. 3C, embodiments may also be envisaged where no clamping is performed in low gain, active mode, meaning that clamping circuits (Clamp1, Clamp3) are not activated and the corresponding switches (S11, S31) do not select any position and are placed in an isolated mode (ISO).

Figure 3D:
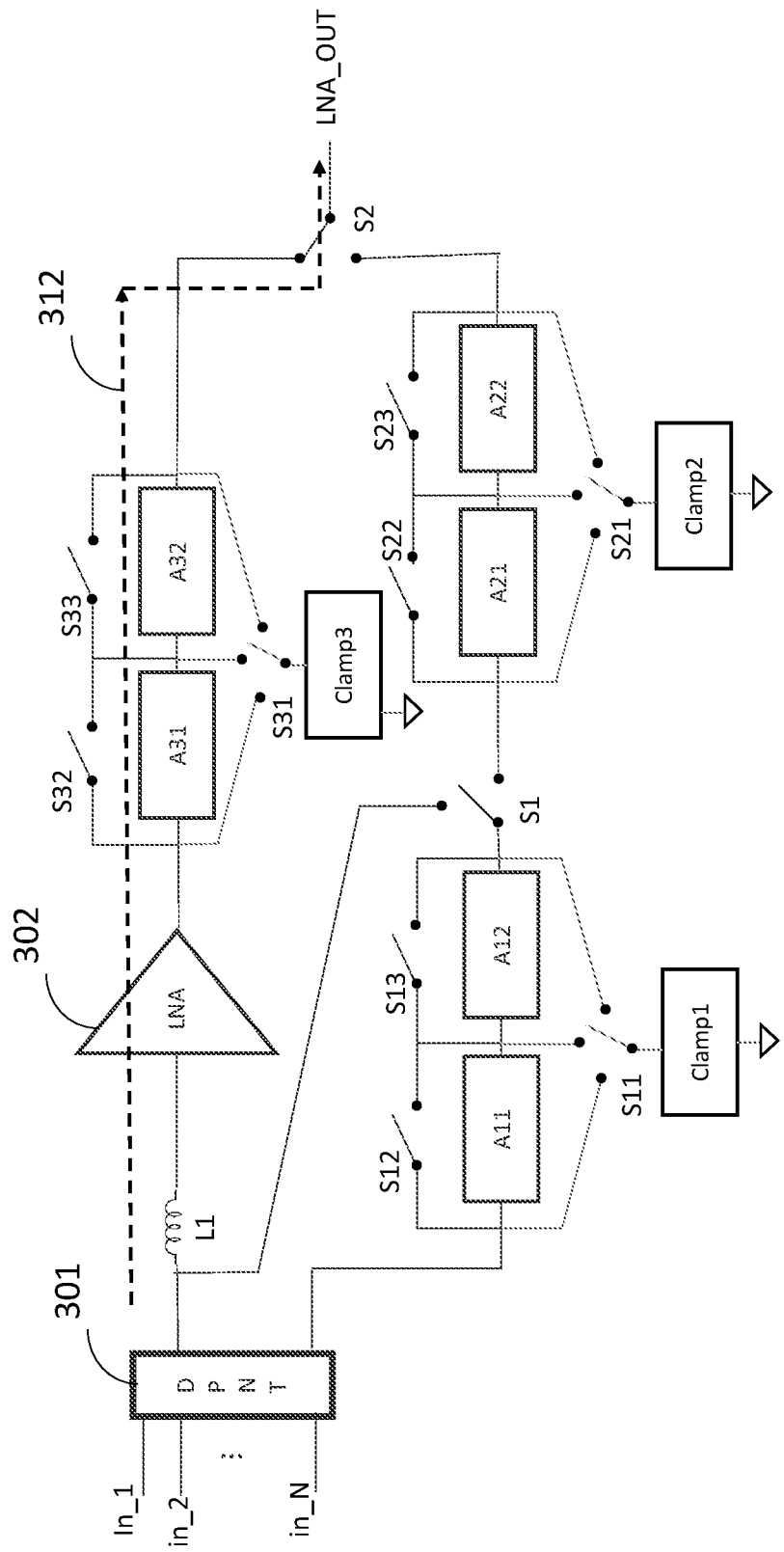

FIG. 3D shows RF receiver front-end (300A) of FIG. 3A operating in high gain active mode where the signal path is indicated by dotted line (312). In the high gain active mode the signal is not attenuated before passing through the LNA to the output. In this mode, as mentioned previously, clamping should occur if the inherent saturation power of the LNA is greater than the required maximum power at the LNA output. In this case, clamping is performed using clamping circuit (Clamp3) and the corresponding switch (S31). Either or both switchable attenuators (A31, A32) may be selectively switched in and clamping may selectively be performed at the input or output of the switchable attenuators (A31, A32).

There may be cases in which clamping cannot be performed at the input of LNA (302) or where stringent NF (noise figure) requirements have to be implemented in the low gain mode. In such cases, embodiments of the present disclosure can be provided where clamping occurs with switchable clamps (Clamp2, Clamp3) only. In particular:
in the embodiment of FIG. 3B only switchable Clamp2 will be activated; and
in the embodiment of FIGS. 3C and 3D only switchable Clamp 3 will be activated.

Figure 4:
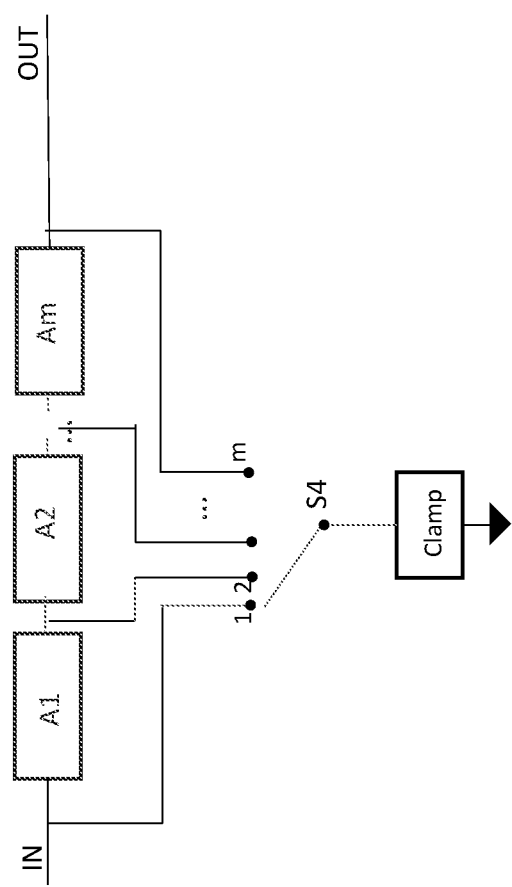
FIG. 4 shows an exemplary circuit arrangement using a clamping technique according to an embodiment of the present disclosure.

With reference to FIGS. 3A-3D, the person skilled in the art will understand that an arbitrary number of attenuators can be used in any mode and in conjunction with each clamping circuit. This is shown in FIG. 4 where a clamping circuit (Clamp) together with a single pole m-throw switch (S4) is implemented to selectively switch in an out an arbitrary number of attenuators (A1, . . . , Am). Embodiments are also possible where the number of attenuators pertaining to one clamping circuit+switch is independent from the number of attenuators pertaining to another clamping circuit+switch. In accordance with the teachings of the present disclosure:
A) switch (S4) may either be in one of positions (1, 2, . . . , m), or
B) switch (S4) may not be in any of positions (1, 2, . . . , m) such that clamping circuit (Clamp) is disconnected from attenuators (A1, . . . , Am) and rest of the circuit.

Throughout the disclosure, and for the case A above, the clamping circuit (Clamp) is said to be active, and for the case B above, the clamping circuit (Clamp) is said to be inactive. With reference to FIGS. 3A-3D, and 4, cases A and B above also apply to switches (S11, S21, S31). Moreover, terms "active" and "inactive" as described above also apply to clamp circuits (Clamp1, . . . Clamp3) of FIGS. 3A-3D.

Figure 6A:
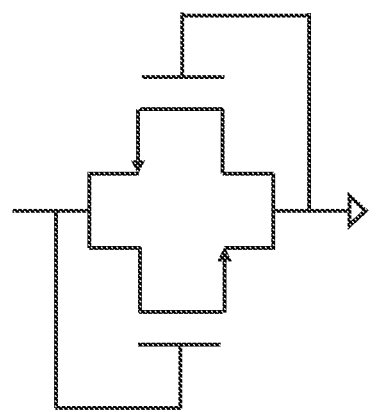
FIGS. 6A-6B show exemplary implementations of clamping circuits.
Figure 6B:
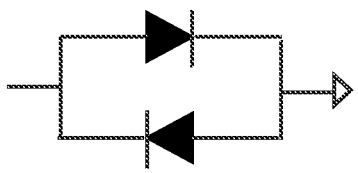

With reference to FIGS. 3A-3D, embodiments implementing all three clamping circuits may be envisaged. In operative conditions, such embodiments may operate based on the following:
in the high gain mode, clamping circuit (Clamp3) may be active and clamping circuits (Clamp1, Clamp2) may be inactive
in the low gain mode, clamping circuit (Clamp1) may be active and clamping circuits (Clamp2, Clamp3) may be inactive
in the low gain mode, clamping circuits (Clamp1 and Clamp3) may be active and clamping circuit (Clamp2) may be inactive
in the bypass mode, clamping circuit (Clamp2) may be active and clamping circuits (Clamp1, Clamp3) may be inactive or clamping circuit (Clamp1) may be active and Clamping circuits (Clamp2, Clamp3) may be inactive.
in the bypass mode, clamping circuits (Clamp1 and Clamp2) may be active and clamping circuit (Clamp3) may be inactive With further reference to FIGS. 3A-3D, according to embodiments of the present disclosure, LNA (302) may comprise single input, multi-input, single gain mode, or multi gain mode LNAs or a combination thereof. Additionally, while a low noise amplifier (LNA) is described here as a preferred embodiment, the person skilled in the art will understand that other kinds of RF amplifiers, not necessarily LNAs, may be adopted. Each of the switches (Sij, i=1, . . . , 3, j=2,3) across the attenuators may be optional and therefore, each of the attenuators (Aij, i=1, . . . , 3, j=1,2) may be a fixed or a switchable attenuator. Each of the attenuators (Aij, i=1, . . . , 3, j=1,2) may have any configuration. Examples are Pi, T, switchable Pi, switchable T attenuators as shown respectively in FIGS. 5A-5D, a series resistor, or a combination thereof. Examples of implementation of each clamping circuit (Clamp1, Clamp2, Clamp3) are shown in FIGS. 6A-6B illustrating antiparallel diode connected NMOS pair, and antiparallel diode pairs configurations, respectively. PMOS pairs may also be used to implement such clamping circuits.

With further reference to FIGS. 3A-3D, the person skilled in the art will appreciate that:
the implemented switches used in tandem with clamping circuits do not need to meet stringent ON resistance (Ron) requirements. The reason is that clamping is active when the input power surges to higher levels, at which point stringent overall performance requirements for the receiver front-end or the LNA do not generally apply.
the implemented switches used in tandem with clamping circuits do not need to meet stringent size requirements commonly imposed due to electrostatic discharge (ESD). The reason is that such switches are protected on the input side by DPNT switch (301) and also on the output side by switch (S2).

The person skilled in the art will understand that the usage of the disclosed methods and devices is not limited to RF receiver front-ends or the LNAs, and such methods and devices can also be applied to or implemented at any point(s) in the electronic circuits where clamping is needed.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) receiver front-end comprising:
a first signal path having a first signal path input and a first signal path output;
one or more first attenuators disposed in the first signal path;
a clamping circuit switchably connected, through a clamping switch (S21), to the one or more first attenuators and configured to switchably clamp an input signal through the first signal path i) at an input of any first attenuator of the one or more first attenuators or ii) at the first signal path output, thereby maintaining a signal power level at the first signal path output at less than a set threshold.

2. The RF receiver front-end of claim 1, wherein each first attenuator of the one or more first attenuators is independently selected from the group consisting of a switchable attenuator and a fixed attenuator.

3. The RF receiver front-end of claim 2, further comprising one or more first attenuator switches coupled across corresponding one or more switchable attenuators, the one or more first attenuator switches being configured to selectively switch in and out and the corresponding one or more switchable attenuators based on performance requirements of the RF receiver front-end.

4. The RF receiver front-end of claim 1, further comprising a low noise amplifier (LNA) and an output switch configured to selectively connect an output of the RF receiver front-end to a) an output of the LNA or b) the first signal path output.

5. The RF receiver front-end of claim 4, configured, in a bypassing mode, to convey the input signal from the first signal path input and through the first signal path to the output of the RF receiver front-end, thereby bypassing the LNA.

6. The RF receiver front-end of claim 4, further comprising a second signal having a second signal path input and a second signal path output, the LNA being disposed in the second signal path.

7. The RF receiver front-end of claim 6, configured, in a high gain mode, to convey the input signal from the second signal path input, and through the LNA, to the output of the RF receiver front-end.

8. The RF receiver front-end of claim 7, further comprising a series arrangement of one or more second attenuators coupling the first signal path input to an input of the LNA, and wherein the RF receiver front-end is configured, in a low gain mode, to convey the input signal at the first signal path input and through a third signal path including the one or more second attenuators and the LNA, to the output of the RF receiver front-end.

9. The RF receiver front-end of claim 8, further comprising a path selection switch configured to selectively switch routing of the input signal between the first signal path and the third signal path.

10. The RF receiver front-end of claim 9, further comprising a double-pole n-throw switch having a first pole coupled to the first signal path input and a second pole coupled to the second signal path input, and wherein the throws are configured to receive a plurality of signals in correspondence with a plurality of frequency bands.

11. A radio frequency (RF) receiver front-end comprising:
a first signal path having a first signal path input and a first signal path output;
a low noise amplifier (LNA) disposed in the first signal path;
a series arrangement of one or more first attenuators disposed at an output of the LNA in the first signal path;
a clamping circuit switchably connected, through a clamping switch to the one or more first attenuators and configured to clamp an input signal i) at an input of any first attenuator of the one or more first attenuators or ii) at the first signal path output, thereby maintaining a signal power level at the first signal path output at less than a set threshold.

12. The RF receiver front-end of claim 11, wherein each first attenuator of the one or more first attenuators is independently selected from the group consisting of a switchable attenuator and a fixed attenuator.

13. The RF receiver front-end of claim 12, further comprising one or more first attenuator switches coupled across corresponding one or more first attenuators, the one or more first attenuator switches being configured to selectively switch the corresponding one or more switchable attenuators in and out based on performance requirements of the RF receiver front-end.

14. The RF receiver front-end of claim 13 configured, in a high gain mode, to convey the input signal from the first signal path input, and through the LNA and the one or more first attenuators, to the first signal path output.

15. The RF receiver front-end of claim 14, further comprising:
a second signal path having a second signal path input;
one or more second attenuators coupling selectively the second signal path to the input of the LNA or to an output of the series arrangement of the one or more second attenuators,
an output switch configured to selectively connect either of the second signal path output and the output of the series arrangement of the one or more second attenuators to an output of the RF receiver front-end.

16. The RF receiver front-end of claim 15, configured:
in a low gain mode, to convey the input signal at the second signal path input, through the LNA and the one or more first attenuators, to the output of the RF receiver front-end, and
in a bypass mode, to convey the input signal at the second signal path input, through the one or more second attenuators, to the output of the RF receiver front-end.

17. A radio frequency (RF) receiver front-end comprising:
a first signal path having a first signal path input;
a low noise amplifier (LNA) disposed in the first signal path;
a series arrangement of one or more attenuators coupling the first signal path input to an input of the LNA; the series arrangement of the one or more attenuators being disposed in the first signal path;
a clamping circuit switchably connected, through a clamping switch (S11), to the series arrangement of one or more attenuators and configured to switchably clamp an input signal through the first signal path i) at an input of any attenuator of the one or more attenuators or ii) at an output of the series arrangement of the one or more attenuators, thereby maintaining a signal power level at an output of the LNA at less than a set threshold.

18. The RF receiver front-end of claim 17, wherein each attenuator of the one or more attenuators is independently selected from the group consisting of a switchable attenuator and a fixed attenuator.

19. The RF receiver front-end of claim 18, further comprising an output switch (S2) selectively connecting an output of the RF receiver front-end to a) the output of the LNA or b) an output of the series arrangement of the one or more attenuators.

20. The RF receiver of claim 19, configured, in a low gain mode, to convey the input signal at the first signal path input, through the one or more attenuators and the LNA, to the output of the RF receiver front-end.

21. The RF receiver front-end of claim 19, configured, in a high gain mode, to convey the input signal at an input other than the first signal path input, through the LNA, to the output of the RF receiver front-end.

22. The RF receiver front-end of claim 21, configured, in a bypass mode, to convey the input signal at the first signal path input, through one or more attenuators, to the output of the RF receiver front-end, thereby bypassing the LNA.

23. A reconfigurable radio frequency (RF) circuit configurable to be operated according to a first mode a second mode, and a third mode, the circuit comprising an amplifier;
a first, second and third series arrangement of one or more attenuators; and
corresponding first, second and third switchable clamping arrangements configured to switchably clamp a signal through the reconfigurable RF circuit i) at an input of any attenuator of the respective first, second and third series arrangement or ii) at an output of the respective first, second and third series arrangement;
wherein the reconfigurable RF circuit is configured
i) in the first mode, to convey the signal from a first input, through the amplifier and the third series arrangement, to an output of the RF circuit, the third switchable clamping arrangement being active, the first and the second clamping arrangement being inactive,
ii) in the second mode, to convey the signal from a second input, through the first series arrangement and the amplifier, to the output of the RF circuit, at least one of the first and third switchable clamping arrangement being active, the second clamping arrangement being inactive, and iii) in the third mode to convey the signal from the second input, through the third series arrangement, to the output of the RF circuit, at least one of the first and second switchable clamping arrangement being active, the third clamping arrangement being inactive.

24. The reconfigurable RF circuit of claim 23, wherein the one or more attenuators of each of the first, second and third series arrangement are switchable attenuators, and wherein:
   a) in the first mode, at least one attenuator of the third series arrangement is switched in,
   b) in the second mode, at least one attenuator of the second series arrangement is switched in, and
   c) in the third mode, at least one attenuator of the first series arrangement s is switched in.

\* \* \* \* \*